US012674844B2

(12) United States Patent
Kim et al.

(10) Patent No.: US 12,674,844 B2
(45) Date of Patent: Jul. 7, 2026

(54) BATTERY DIAGNOSING APPARATUS AND METHOD

(71) Applicant: LG Energy Solution, Ltd., Seoul (KR)

(72) Inventors: Young-Deok Kim, Daejeon (KR);
Dae-Soo Kim, Daejeon (KR)

(73) Assignee: LG Energy Solution, Ltd., Seoul (KR)

( * ) Notice: Subject to any disclaimer, the term of this patent is extended or adjusted under 35 U.S.C. 154(b) by 597 days.

(21) Appl. No.: 18/017,749

(22) PCT Filed: Apr. 1, 2022

(86) PCT No.: PCT/KR2022/004716
§ 371 (c)(1),
(2) Date: Jan. 24, 2023

(87) PCT Pub. No.: WO2022/215962
PCT Pub. Date: Oct. 13, 2022

(65) Prior Publication Data
US 2023/0296688 A1     Sep. 21, 2023

(30) Foreign Application Priority Data
Apr. 8, 2021   (KR) ........................ 10-2021-0046137

(51) Int. Cl.
*G06F 11/30*        (2006.01)
*G01R 31/36*        (2020.01)
(Continued)

(52) U.S. Cl.
CPC ....... *G01R 31/392* (2019.01); *G01R 31/3648* (2013.01); *G01R 31/367* (2019.01); *G01R 31/389* (2019.01)

(58) Field of Classification Search
CPC .................................................... G01R 31/392
See application file for complete search history.

(56) References Cited

U.S. PATENT DOCUMENTS 5,703,469 A    12/1997   Kinoshita
2010/0042345 A1    2/2010   Kang et al.
(Continued)

FOREIGN PATENT DOCUMENTS

CN        101688899 B    6/2013
CN        105548900 A    5/2016
(Continued)

OTHER PUBLICATIONS

International Search Report for Application No. PCT/KR2022/004716 mailed Jul. 7, 2022, pp. 1-3.
(Continued)

*Primary Examiner* — Phuong Huynh
(74) *Attorney, Agent, or Firm* — Lerner David LLP

(57)        ABSTRACT

A battery diagnosing apparatus includes a measuring unit configured to measure a current, a voltage and an OCV of a battery, a resistance estimating unit configured to estimate a resistance of the battery based on the current and the voltage measured by the measuring unit, and a control unit configured to calculate a voltage deviation for a criterion OCV set to correspond to the battery and the OCV measured by the measuring unit, calculate a resistance deviation for a criterion resistance set to correspond to the battery and the resistance estimated by the resistance estimating unit, and diagnose a state of the battery based on a voltage increase/decrease pattern for the voltage deviation and a resistance increase/decrease pattern for the resistance deviation.

16 Claims, 9 Drawing Sheets

100

(51) Int. Cl.
    *G01R 31/367*    (2019.01)
    *G01R 31/389*    (2019.01)
    *G01R 31/392*    (2019.01)

(56)           References Cited

U.S. PATENT DOCUMENTS

| | | | |
|---|---|---|---|
| 2010/0174499 A1 | 7/2010 | Kang et al. | |
| 2011/0187329 A1 | 8/2011 | Majima et al. | |
| 2011/0256434 A1 | 10/2011 | Kang et al. | |
| 2012/0191390 A1 | 7/2012 | Kang et al. | |
| 2016/0061908 A1 | 3/2016 | Torai et al. | |
| 2017/0307693 A1 | 10/2017 | Fukuda et al. | |
| 2020/0018799 A1 | 1/2020 | Lim et al. | |
| 2021/0156923 A1 | 5/2021 | Nam et al. | |
| 2021/0318388 A1 | 10/2021 | Bae et al. | |
| 2021/0325475 A1* | 10/2021 | Bae | G01R 31/3835 |
| 2021/0325476 A1 | 10/2021 | Bae et al. | |
| 2022/0158255 A1 | 5/2022 | Choi et al. | |

FOREIGN PATENT DOCUMENTS

| | | | |
|---|---|---|---|
| CN | 107004917 A | 8/2017 | |
| JP | H8336202 A | 12/1996 | |
| JP | 3721853 B2 | 11/2005 | |
| JP | 201066161 A | 3/2010 | |
| JP | 2010093875 A | 4/2010 | |
| JP | 6123844 B2 | 5/2017 | |
| JP | 2017111058 A | 6/2017 | |
| JP | 2017223454 A | 12/2017 | |
| KR | 100927541 B1 | 11/2009 | |
| KR | 20160062468 A | 6/2016 | |
| KR | 20190036982 A | 4/2019 | |
| KR | 20190084686 A | 7/2019 | |
| KR | 20200111014 A | 9/2020 | |
| KR | 20200111016 A | 9/2020 | |
| KR | 20200111017 A | 9/2020 | |
| KR | 20210036258 A | 4/2021 | |
| WO | 2020189914 A1 | 9/2020 | |

OTHER PUBLICATIONS

Extended European Search Report including Written Opinion for Application No. 22784872.8 dated Mar. 19, 2024, pp. 1-9.

* cited by examiner

| SOC(%) | POSITIVE ELECTRODE RESISTANCE(Ω) | NEGATIVE ELECTRODE RESISTANCE(Ω) |
|---|---|---|
| 0 | 1.1 | 0.67 |
| 5 | 0.75 | 0.39 |
| 10 | 0.4 | 0.11 |
| 15 | 0.3 | 0.13 |
| 20 | 0.2 | 0.15 |

| CASE | BATTERY RESISTANCE(Ω) | POSITIVE ELECTRODE RESISTANCE(Ω) | NEGATIVE ELECTRODE RESISTANCE(Ω) |
|---|---|---|---|
| REF | 1.14 | 0.75 | 0.39 |
| CASE 1 | 0.86 | 0.75 | 0.11 |
| CASE 2 | 0.79 | 0.4 | 0.39 |
| CASE 3 | 0.51 | 0.4 | 0.11 |
| CASE 4 | 1.77 | 1.1 | 0.67 |

SIDE REACTION STATE { CASE 1, CASE 2

RESISTANCE INCREASE STATE { CASE 3

RESISTANCE DECREASE STATE { CASE 4

CASE 1, CASE 2

| BATTERY STATE | VOLTAGE INCREASE/ DECREASE PATTERN | RESISTANCE INCREASE/ DECREASE PATTERN |
|---|---|---|
| SIDE REACTION STATE (CASE 1, CASE 2) | DECREASE PATTERN | DECREASE PATTERN |
| RESISTANCE INCREASE STATE (CASE 3) | INCREASE PATTERN | DECREASE PATTERN |
| RESISTANCE DECREASE STATE (CASE 4) | DECREASE PATTERN | INCREASE PATTERN |

BATTERY DIAGNOSING APPARATUS AND METHOD

CROSS-REFERENCE TO RELATED APPLICATIONS

The present application is a national phase entry under 35 U.S.C. § 371 of International Application No. PCT/KR2022/004716 filed on Apr. 1, 2022, which claims priority from Korean Patent Application No. 10-2021-0046137 filed on Apr. 8, 2021, all of which are incorporated herein by reference.

TECHNICAL FIELD

The present disclosure relates to a battery diagnosing apparatus and method, and more particularly, to a battery diagnosing apparatus and method capable of diagnosing a state of a battery based on an open circuit voltage (OCV) and resistance of the battery.

BACKGROUND ART

Recently, the demand for portable electronic products such as notebook computers, video cameras and portable telephones has increased sharply, and electric vehicles, energy storage batteries, robots, satellites and the like have been developed in earnest. Accordingly, high-performance batteries allowing repeated charging and discharging are being actively studied.

Batteries commercially available at present include nickel-cadmium batteries, nickel hydrogen batteries, nickel-zinc batteries, lithium batteries and the like. Among them, the lithium batteries are in the limelight since they have almost no memory effect compared to nickel-based batteries and also have very low self-charging rate and high energy density.

Since such a battery is degraded as it is operated, various studies are being conducted to more accurately estimate the state and the state of health (SOH) of the battery in operation.

For example, a study is underway to check the peak behavior in the V–dQ/dV profile representing the corresponding relationship between the voltage (V) and the differential capacity (dQ/dV), which is a change rate of capacity (Q) with respect to voltage (V) of the battery, or to confirm the peak behavior in the Q–dV/dQ profile representing the corresponding relationship between the capacity (Q) and the differential voltage (dV/dQ), which is a change rate with respect to the voltage (V) for the capacity (Q).

However, since it is substantially impossible to accurately measure the state and SOH of the battery only with battery information such as voltage, current and capacity of the battery without disassembling and testing the battery, it is required to develop a technology for estimating the state of the battery more simply and accurately.

SUMMARY

Technical Problem

The present disclosure is designed to solve the problems of the related art, and therefore the present disclosure is directed to providing a battery diagnosing apparatus and method capable of specifically diagnosing a state of a battery as a side reaction degradation state, a resistance increase state or a resistance decrease state based on OCV and resistance of the battery.

These and other objects and advantages of the present disclosure may be understood from the following detailed description and will become more fully apparent from the exemplary embodiments of the present disclosure. Also, it will be easily understood that the objects and advantages of the present disclosure may be realized by the means shown in the appended claims and combinations thereof.

Technical Solution

A battery diagnosing apparatus according to one aspect of the present disclosure may comprise: a controller and memory having programmed thereon instructions that, when execute, are configured to cause the controller to: calculate a voltage deviation between a threshold open circuit voltage (OCV) corresponding to the battery and a measured OCV of the battery, calculate a resistance deviation between a threshold resistance corresponding to the battery and an estimated resistance based on a measured voltage and a measured current of the battery, and diagnose a state of the battery based on a voltage increase/decrease pattern for the voltage deviation and a resistance increase/decrease pattern for the resistance deviation.

The state of the battery may be one of a side reaction state, a resistance increase state or a resistance decrease state.

The instructions may be configured to cause the controller to diagnose the state of the battery as the side reaction state, the resistance increase state or the resistance decrease state based on a comparison of the voltage increase/decrease pattern and the resistance increase/decrease pattern.

The instructions may be configured to cause the controller to diagnose the state of the battery as the side reaction state in response to the voltage increase/decrease pattern and the resistance increase/decrease pattern being identical to each other.

The instructions may be configured to cause the controller to diagnose the state of the battery as the resistance increase state or the resistance decrease state, in response to the voltage increase/decrease pattern and the resistance increase/decrease pattern being different from each other.

The instructions may be configured to cause the controller to diagnose the state of the battery as the resistance increase state, in response to the voltage increase/decrease pattern increasing and the resistance increase/decrease pattern decreasing.

The instructions may be configured to cause the controller to diagnose the state of the battery as the resistance decrease state, in response to the voltage increase/decrease pattern decreasing and the resistance increase/decrease pattern increasing.

The side reaction state may include at least one of a first degradation state caused by occurrence of a positive electrode side reaction of the battery and a second degradation state caused by occurrence of a negative electrode side reaction.

The instructions may be configured to cause the controller to change at least one of a discharge termination voltage and a charge termination voltage for the battery in response to the state of the battery being diagnosed as the side reaction state.

The instructions may be configured to cause the controller to change at least one of a charge current rate (C-rate) and a discharge C-rate for the battery in response to the state of the battery being diagnosed as the resistance increase state.

The instructions may be configured to cause the controller to, at each of a plurality of different time points; calculate the voltage deviation and the resistance deviation, determine the voltage increase/decrease pattern based on the plurality of calculated voltage deviations and determine the resistance increase/decrease pattern based on the plurality of calculated resistance deviations.

The instructions may be configured to cause the controller to measuring unit may be configured to calculate the resistance deviation based on a ratio between (i) a difference between a first voltage of the battery measured at a first time point at which the battery is discharged to a discharge termination voltage, and a second voltage of the battery measured at a second time point at which a predetermined time has elapsed from the first time point and (ii) a discharge current of the battery, and calculate the voltage deviation based on an OCV measured at a third time point later than the second time point.

A battery pack according to another aspect of the present disclosure may comprise the battery diagnosing apparatus according to any of the embodiments of the present disclosure.

A battery diagnosing method according to still another aspect of the present disclosure may comprise: measuring a current, a voltage and an OCV of a battery; estimating a resistance of the battery based on the current and the voltage measured in the measuring step; calculating, by a controller, a voltage deviation between a threshold OCV corresponding to the battery and the OCV; calculating, by the controller, a resistance deviation between a threshold resistance corresponding to the battery and the resistance; and diagnosing a state of the battery based on a voltage increase/decrease pattern for the voltage deviation and a resistance increase/decrease pattern for the resistance deviation.

Advantageous Effects

According to one aspect of the present disclosure, the battery diagnosing apparatus has an advantage of specifically diagnosing the state of a battery based on the voltage increase/decrease pattern and the resistance increase/decrease pattern.

In addition, according to one aspect of the present disclosure, the battery diagnosing apparatus has an advantage of increasing the lifespan of the battery by controlling the charging and discharging of the battery to correspond to the diagnosed state of the battery.

The effects of the present disclosure are not limited to the effects mentioned above, and other effects not mentioned will be clearly understood by those skilled in the art from the description of the claims.

BRIEF DESCRIPTION OF THE DRAWINGS

The accompanying drawings illustrate a preferred embodiment of the present disclosure and together with the foregoing disclosure, serve to provide further understanding of the technical features of the present disclosure, and thus, the present disclosure is not construed as being limited to the drawing.

DETAILED DESCRIPTION

It should be understood that the terms used in the specification and the appended claims should not be construed as limited to general and dictionary meanings, but interpreted based on the meanings and concepts corresponding to technical aspects of the present disclosure on the basis of the principle that the inventor is allowed to define terms appropriately for the best explanation.

Therefore, the description proposed herein is just a preferable example for the purpose of illustrations only, not intended to limit the scope of the disclosure, so it should be understood that other equivalents and modifications could be made thereto without departing from the scope of the disclosure.

Additionally, in describing the present disclosure, when it is deemed that a detailed description of relevant known elements or functions renders the key subject matter of the present disclosure ambiguous, the detailed description is omitted herein.

The terms including the ordinal number such as "first", "second" and the like, may be used to distinguish one element from another among various elements, but not intended to limit the elements by the terms.

Throughout the specification, when a portion is referred to as "comprising" or "including" any element, it means that the portion may include other elements further, without excluding other elements, unless specifically stated otherwise.

In addition, throughout the specification, when a portion is referred to as being "connected" to another portion, it is not limited to the case that they are "directly connected", but it also includes the case where they are "indirectly connected" with another element being interposed between them.

Hereinafter, preferred embodiments of the present disclosure will be described in detail with reference to the accompanying drawings.

Figure 1:
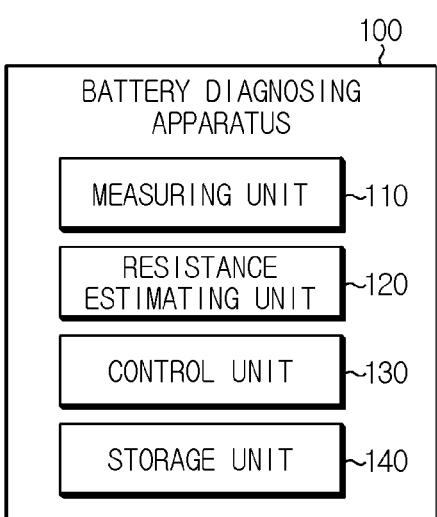
FIG. 1 is a diagram schematically showing a battery diagnosing apparatus according to an embodiment of the present disclosure.

FIG. 1 is a diagram schematically showing a battery diagnosing apparatus 100 according to an embodiment of the present disclosure.

Referring to FIG. 1, the battery diagnosing apparatus 100 may include a measuring unit 110, a resistance estimating unit 120 and a control unit 130.

The measuring unit 110 may be configured to measure a current, a voltage and an OCV (Open Circuit Voltage) of a battery.

Here, the battery means a physically separable one independent cell having a negative electrode terminal and a positive electrode terminal. For example, a lithium-ion battery or a lithium polymer battery may be considered as the battery. In addition, the battery may refer to a battery module in which a plurality of cells are connected in series and/or in parallel. Hereinafter, for convenience of explanation, the battery will be described as meaning one independent cell.

Specifically, the measuring unit 110 may measure a discharge current of the battery and determine a first voltage of the battery at a first time point at which the battery is discharged to a discharge termination voltage.

Here, the discharge termination voltage is a voltage corresponding to a state in which the battery is completely discharged, and may be preset according to battery specifications and a battery usage destination. For example, the discharge termination voltage may be preset to any one of 2.5 V to 2.8 V.

The measuring unit 110 may measure a discharge current output while the battery is being discharged. Preferably, the discharge current may be a constant current.

For example, the measuring unit 110 may measure a first voltage of the battery at a first time point at which the voltage of the battery reaches the discharge termination voltage. Preferably, if the measurement error by the measuring unit 110 is ignored, the first voltage may be the same as the discharge termination voltage.

As another example, since the first voltage is the same as the discharge termination voltage in a preferred case, the measuring unit 110 may determine the preset discharge termination voltage as the first voltage without separately measuring the first voltage. That is, the measuring unit 110 may determine whether or not to stop discharging the battery based on the change in magnitude of the measured discharge current of the battery. Accordingly, the measuring unit 110 may determine the time point at which the discharge of the battery is stopped as the first time point, and determine the first voltage as a preset discharge termination voltage.

In addition, the measuring unit 110 may be configured to measure a second voltage of the battery at a second time point at which a predetermined time has elapsed from the first time point.

Preferably, discharging of the battery may be stopped from the first time point at which the voltage of the battery reaches the discharge termination voltage. In addition, the measuring unit 110 may measure the second voltage of the battery at the second time point at which a predetermined time has elapsed from the first time point.

For example, the second time point may be a time point at which 10 seconds have elapsed from the first time point. That is, the measuring unit 110 may measure the second voltage of the battery at the second time point at which 10 seconds have elapsed from the first time point at which the voltage of the battery reaches the discharge termination voltage.

In addition, the measuring unit 110 may be configured to measure an OCV of the battery at a third time point later than the second time point.

Here, the third time point may be a time point at which the voltage of the battery is stabilized after polarization according to discharge. That is, the third time point is a time point after a sufficient rest time has elapsed, and may be a time point at which the measuring unit 110 is capable of measuring the OCV of the battery.

For example, the third time point may be a time point at which 30 minutes has elapsed from the first time point. The measuring unit 110 may measure the OCV of the battery in a resting state after 30 minutes have elapsed from the first time point.

The resistance estimating unit 120 may be configured to estimate a resistance of the battery based on the current and the voltage measured by the measuring unit 110.

Specifically, the resistance estimating unit 120 may be configured to estimate the resistance of the battery by calculating the ratio of deviation of the first voltage and the second voltage with respect to the discharge current. That is, the resistance estimating unit 120 may estimate the resistance of the battery based on the voltage deviation after the discharge is stopped at the discharge terminal of the battery.

For example, when the second time point is a time point at which 10 seconds have elapsed from the first time point, the resistance of the battery estimated by the resistance estimating unit 120 may be 10-second resistance (R10) for the battery. That is, the resistance estimating unit 120 may estimate the change in resistance during a predetermined time (e.g., 10 seconds) immediately after the discharge of the battery is stopped.

In general, the resistance of the battery may be calculated through Ohm's law, which is expressed as a ratio of a voltage value to a current value. In addition, the battery may be discharged with a constant current up to the first time point, and discharge may be stopped from the first time point. Accordingly, the resistance estimating unit 120 may estimate the resistance of the battery by calculating the formula of "(second voltage−first voltage)÷discharge current".

The control unit 130 may be configured to calculate a voltage deviation for a criterion OCV set to correspond to the battery and the OCV measured by the measuring unit 110.

Here, the criterion OCV may be set for a battery in a BOL (Beginning of Life) state. The BOL state refers to a battery state in the first charge/discharge cycle of the battery or a charge/discharge cycle less than or equal to a predetermined number of times. Preferably, the criterion OCV may be an OCV measured by the measuring unit 110 in the first charge/discharge cycle of the battery.

For example, the control unit 130 may calculate a voltage deviation for the battery by calculating the formula of "measured OCV−criterion OCV". On the other hand, the control unit 130 may calculate the voltage deviation as a ratio between the measured OCV and the criterion OCV, but hereinafter, for convenience of explanation, it will be described that the control unit 130 calculates the voltage deviation based on the voltage difference between the measured OCV and the criterion OCV.

In addition, the control unit 130 may be configured to calculate a resistance deviation for a criterion resistance set to correspond to the battery and the resistance estimated by the resistance estimating unit 120.

Here, the criterion resistance may be set for a battery in a BOL state. Preferably, the criterion resistance may be a resistance estimated by the resistance estimating unit 120 in the first charge/discharge cycle of the battery.

For example, the control unit 130 may calculate the resistance deviation for the battery by calculating the formula of "estimated resistance÷criterion resistance×100". On the other hand, the control unit 130 may calculate the resistance deviation based on the resistance difference between the estimated resistance and the criterion resistance, but hereinafter, for convenience of explanation, it will be described that the control unit 130 calculates the resistance deviation based on the ratio of the estimated resistance to the criterion resistance.

The control unit 130 may be configured to diagnose the state of the battery based on a voltage increase/decrease pattern for the voltage deviation and a resistance increase/decrease pattern for the resistance deviation.

Here, the voltage increase/decrease pattern may be an increase pattern or a decrease pattern. Likewise, the resistance increase/decrease pattern may be an increase pattern or a decrease pattern.

For example, the control unit 130 may periodically or aperiodically calculate a voltage deviation and determine a voltage increase/decrease pattern for the plurality of calculated voltage deviations. Also, the control unit 130 may periodically or aperiodically calculate a resistance deviation and determine a resistance increase/decrease pattern for the plurality of calculated resistance deviations. In addition, the control unit 130 may diagnose the state of the battery according to the determined voltage increase/decrease pattern and the determined resistance increase/decrease pattern.

That is, the control unit 130 may be configured to determine a voltage increase/decrease pattern based on a plurality of voltage deviations calculated at different time points and determine a resistance increase/decrease pattern based on a plurality of resistance deviations calculated at different time points.

Specifically, the control unit 130 may be configured to diagnose the state of the battery as a side reaction state, a resistance increase state, or a resistance decrease state according to the voltage increase/decrease pattern and the resistance increase/decrease pattern.

The side reaction state may include at least one of a degradation state caused by the occurrence of a positive electrode side reaction of the battery and a degradation state caused by the occurrence of a negative electrode side reaction. In addition, the resistance increase state is a state in which the internal resistance of the battery is increased, and the resistance decrease state is a state in which the internal resistance of the battery is decreased.

Here, it should be noted that the internal resistance of the battery is different from the battery resistance estimated by the resistance estimating unit 120. That is, the internal resistance of the battery is an internal resistance directly related to the SOH (State of Health) of the battery, whereas the battery resistance estimated by the resistance estimating unit 120 is a discharge terminal resistance according to the voltage change during a predetermined time (e.g., 10 seconds) after the discharge of the battery is finished.

The battery diagnosing apparatus 100 according to an embodiment of the present disclosure has an advantage of specifically classifying the state of the battery into a side reaction state, a resistance increase state and a resistance decrease state based on the voltage increase/decrease pattern and the resistance increase/decrease pattern of the battery. Accordingly, there is an advantage that the state of the battery can be specifically diagnosed in a non-destructive manner even in a state in which the battery is operating in a vehicle, an energy storage system (ESS), or the like.

Meanwhile, the control unit 130 provided to the battery diagnosing apparatus 100 may optionally include a processor, an application-specific integrated circuit (ASIC), another chipset, a logic circuit, a register, a communication modem, and a data processing device, and the like, known in the art to execute various control logics performed in the present disclosure. In addition, when the control logic is implemented in software, the control unit 130 may be implemented as a set of program modules. At this time, the program module may be stored in a memory and executed by the control unit 130. The memory may be provided in or out of the control unit 130, and may be connected to the control unit 130 by various well-known means.

In addition, the battery diagnosing apparatus 100 may further include a storage unit 140. The storage unit 140 may store data or programs necessary for operation and function of each component of the battery diagnosing apparatus 100, data generated in the process of performing the operation or function, or the like. The storage unit 140 is not particularly limited in its kind as long as it is a known information storage means that can record, erase, update and read data. As an example, the information storage means may include random access memory (RAM), flash memory, read-only memory (ROM), electrically erasable programmable read-only memory (EEPROM), registers, and the like. In addition, the storage unit 140 may store program codes in which processes executable by the control unit 130 are defined.

For example, the storage unit 140 may store the current, the voltage and the OCV measured by the measuring unit 110. In addition, the storage unit 140 may store the resistance estimated by the resistance estimating unit 120. The resistance estimating unit 120 may directly obtain information on the current and the voltage from the measuring unit 110, or may access the storage unit 140 to obtain the stored information on the current and the voltage. Similarly, the control unit 130 may directly obtain the information on the current, the voltage and the OCV from the measuring unit 110, or may access the storage unit 140 to obtain the obtained information on the current, the voltage and the OCV.

The control unit 130 may be configured to diagnose the state of the battery as a side reaction state, a resistance increase state, or a resistance decrease state according to whether the voltage increase/decrease pattern and the resistance increase/decrease pattern are identical to each other.

Specifically, when the voltage increase/decrease pattern and the resistance increase/decrease pattern are identical, the control unit 130 may be configured to diagnose the state of the battery as a side reaction state. Conversely, when the voltage increase/decrease pattern and the resistance increase/decrease pattern are different, the control unit 130 may be configured to diagnose the state of the battery as a resistance increase state or a resistance decrease state.

For example, when both the voltage increase/decrease pattern and the resistance increase/decrease pattern are the increase pattern or the decrease pattern, the control unit 130 may diagnose the state of the battery as a side reaction state.

As another example, when the voltage increase/decrease pattern is an increase pattern and the resistance increase/decrease pattern is a decrease pattern, the control unit 130 may diagnose the state of the battery as a resistance increase state.

As still another example, when the voltage increase/decrease pattern is a decrease pattern and the resistance increase/decrease pattern is an increase pattern, the control unit 130 may diagnose the state of the battery as a resistance decrease state.

Hereinafter, with reference to FIGS. 2 to 7, the change in resistance of the battery in each of the side reaction state, the resistance increase state and the resistance decrease state will be described.

Figure 2:
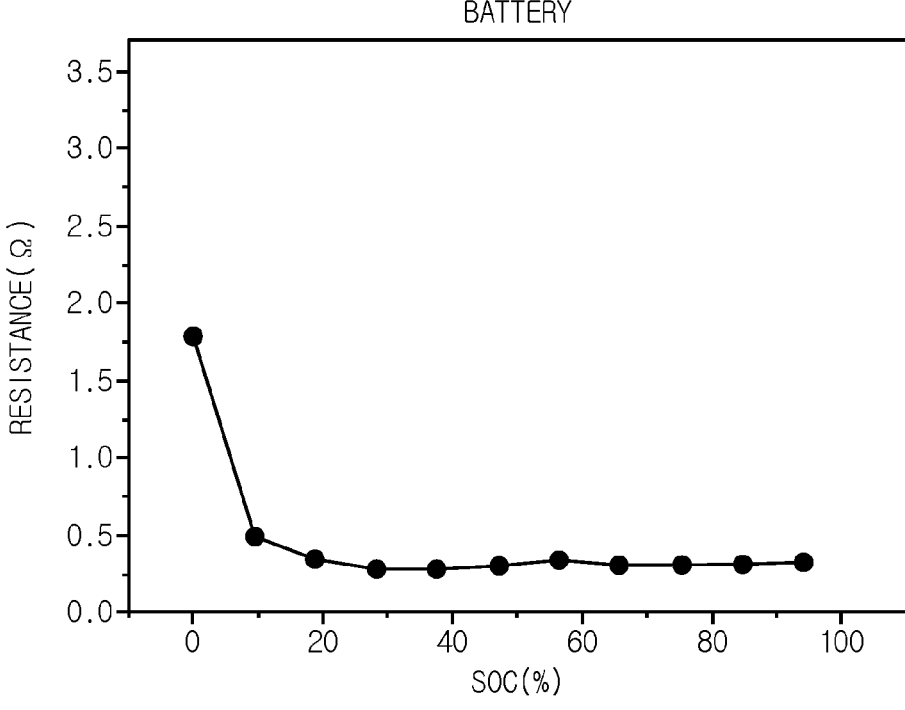
FIGS. 2 to 4 are diagrams showing a state of charge (SOC)-resistance profile for a battery, a positive electrode of the battery, and a negative electrode of the battery according to an embodiment of the present disclosure.
Figure 3:
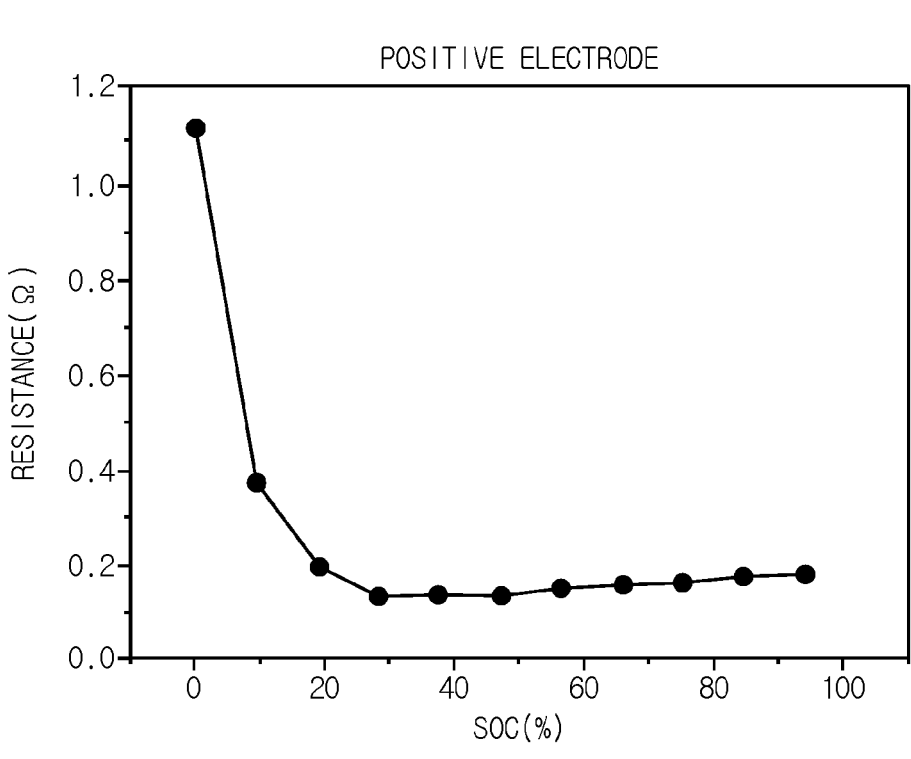
Figure 4:
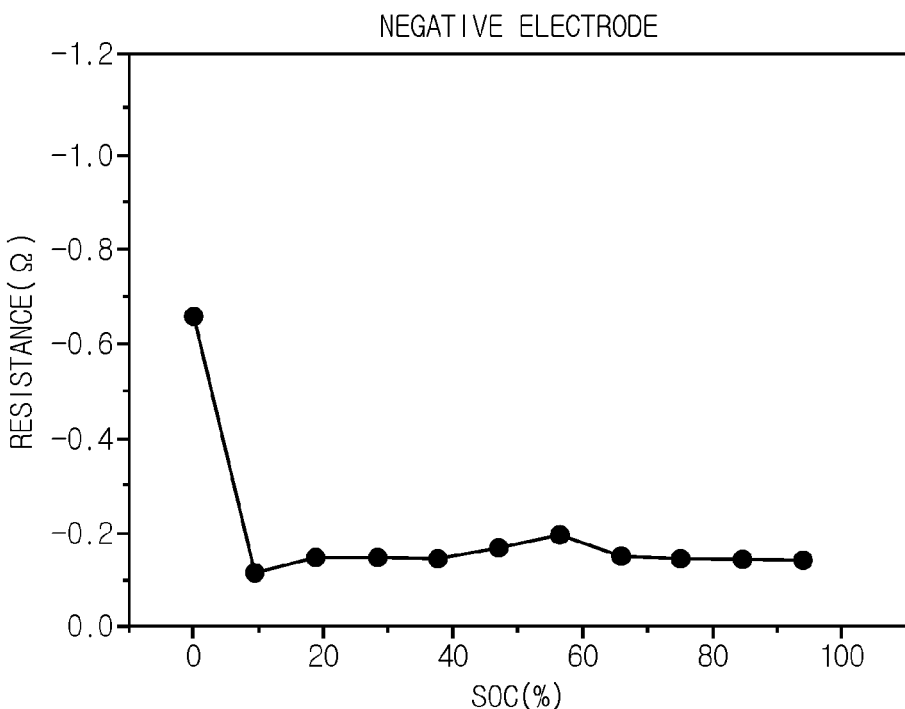
Figures 5, 6:
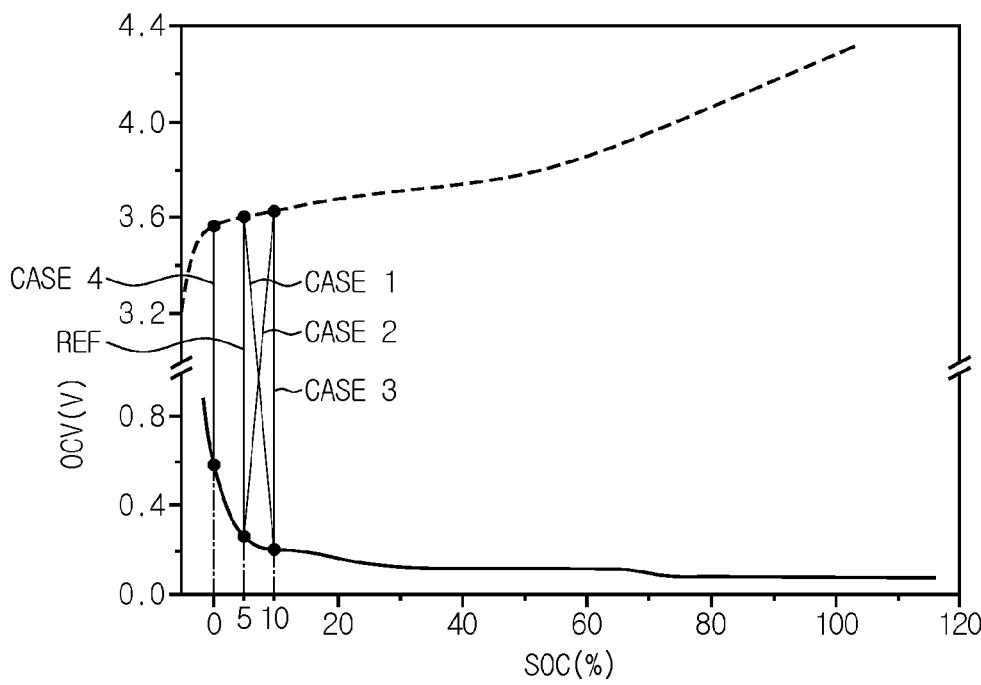
FIG. 5 is a diagram showing a positive electrode resistance and a negative electrode resistance of the battery for a plurality of SOCs, based on FIGS. 3 and 4.
FIG. 6 is a diagram showing a state of charge to open circuit voltage (SOC-OCV) profile of the battery according to an embodiment of the present disclosure.

FIGS. 2 to 4 are diagrams showing a state of charge (SOC)-resistance profile for a battery, a positive electrode of the battery, and a negative electrode of the battery according to an embodiment of the present disclosure. FIG. 5 is a diagram showing a positive electrode resistance and a negative electrode resistance of the battery for a plurality of SOCs, based on FIGS. 3 and 4.

Specifically, FIGS. 2 to 4 are diagrams showing 10-second resistance (R10) for a battery, a positive electrode of the battery, and a negative electrode of the battery according to SOC. That is, the SOC-resistance profiles of FIGS. 2 to 4 may be profiles representing a corresponding relationship between the SOC and the 10-second resistance (R10). As described above, the 10-second resistance (R10) may be a resistance measured based on a voltage change for 10 seconds from the time point at which the discharge is terminated.

However, referring to FIGS. 3 and 4, it should be noted that the signs of resistance are shown as + and − in order to distinguish the positive electrode resistance and the negative electrode resistance. Hereinafter, the negative electrode resistance will be described as a resistance value of + sign.

Referring to FIGS. 2 to 4, it may be seen that all of the resistances of the battery, the positive electrode, and the negative electrode abruptly increase in the region of about SOC 20% or less.

Referring to FIG. 5, the positive electrode resistance of the battery and the negative electrode resistance of the battery may be found at SOC 0%, 5%, 10%, 15% and 20%.

At SOC 0%, the positive electrode resistance of the battery is 1.1Ω and the negative electrode resistance is 0.67Ω.

At SOC 5%, the positive electrode resistance of the battery is 0.75Ω and the negative electrode resistance is 0.39Ω.

At SOC 10%, the positive electrode resistance of the battery is 0.4Ω and the negative electrode resistance is 0.11Ω.

At SOC 15%, the positive electrode resistance of the battery is 0.3Ω and the negative electrode resistance is 0.13Ω.

At SOC 20%, the positive electrode resistance of the battery is 0.2Ω and the negative electrode resistance is 0.15Ω.

FIG. 6 is a diagram showing a SOC-OCV profile of the battery according to an embodiment of the present disclosure. Specifically, FIG. 6 is a diagram showing embodiments of REF, CASE 1, CASE 2, CASE 3 and CASE 4 according to the change in the SOC balance of the positive electrode and the negative electrode of the battery.

Figures 7, 8:
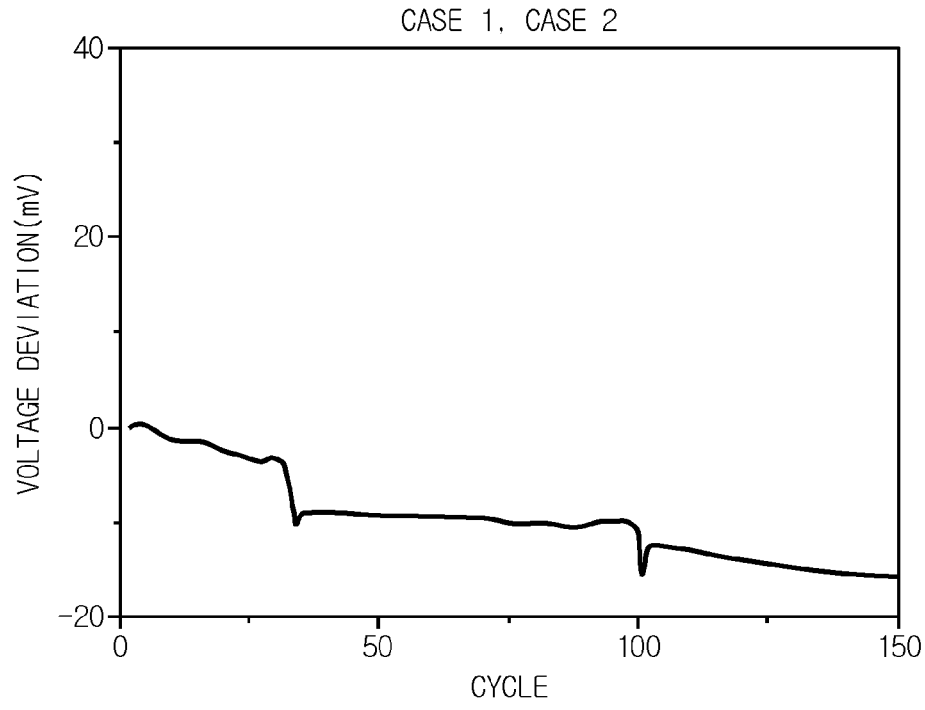
FIG. 7 is diagram showing battery resistance, a positive electrode resistance, and a negative electrode resistance for the state of the battery, based on the SOC-OCV profile of FIG. 6.
FIGS. 8 to 13 are diagrams showing a voltage deviation or a resistance deviation for each state of the battery according to an embodiment of the present disclosure.

FIG. 7 is diagram showing battery resistance, a positive electrode resistance, and a negative electrode resistance for the state of the battery, based on the SOC-OCV profile of FIG. 6.

REF is a criterion embodiment in which the SOC of the battery is 5%, and is an embodiment in which the SOCs of the positive electrode and the negative electrode are 5%.

CASE 1 is a first embodiment in which a side reaction occurs in the positive electrode of the battery, and is an embodiment in which the SOC of the positive electrode is 5% and the SOC of the negative electrode is 10%. That is, this is an embodiment in which the SOC of the negative electrode is degraded by 5% due to the occurrence of the positive electrode side reaction.

CASE 2 is a second embodiment in which a side reaction occurs in the negative electrode of the battery, and is an embodiment in which the SOC of the positive electrode is 10% and the SOC of the negative electrode is 5%. That is, this is an embodiment in which the SOC of the positive electrode is degraded by 5% due to the occurrence of the negative electrode side reaction.

CASE 3 is a third embodiment in which the internal resistance of the battery is increased, and is an embodiment in which the SOCs of the positive electrode and the negative electrode are 10%. That is, this is an embodiment in which the SOCs of the positive electrode and the negative electrode are degraded by 5% due to the increase in the internal resistance of the battery.

CASE 4 is a fourth embodiment in which the internal resistance of the battery is reduced, and is an embodiment in which the SOCs of the positive electrode and the negative electrode are 0%.

Specifically, FIG. 7 is an embodiment in which the battery resistance is calculated for each of REF and CASES 1 to 4 of FIG. 6 with reference to the positive electrode resistance and negative electrode resistance for each SOC shown in FIG. 5.

In REF, since the positive electrode SOC is 5%, the positive electrode resistance is 0.75Ω. In addition, since the negative electrode SOC is 5%, the negative electrode resistance is 0.39Ω. Therefore, the battery resistance is 1.14Ω.

In CASE 1, since the positive electrode SOC is 5%, the positive electrode resistance is 0.75Ω. In addition, since the negative electrode SOC is 10%, the negative electrode resistance is 0.11Ω. Therefore, the battery resistance is 0.86Ω.

In CASE 2, since the positive electrode SOC is 10%, the positive electrode resistance is 0.4Ω. In addition, since the negative electrode SOC is 5%, the negative electrode resistance is 0.39Ω. Therefore, the battery resistance is 0.79Ω.

Specifically, referring to FIGS. 6 and 7, in the case of CASE 1 in which the positive electrode side reaction occurs and CASE 2 in which the negative electrode side reaction occurs, the battery resistance may be reduced due to the change in the SOC balance. In addition, since the battery resistance is reduced at the discharge terminal of the battery, the OCV of the battery measured at the discharge terminal of the battery may also be reduced.

In CASE 3, since the positive electrode SOC is 10%, the positive electrode resistance is 0.4Ω. In addition, since the negative electrode SOC is 10%, the positive electrode resistance is 0.11Ω. Therefore, the battery resistance is 0.51Ω.

Specifically, referring to FIGS. 6 and 7, in the case of CASE 3 in which the internal resistance of the battery is increased, even though the battery resistance is reduced at the discharge terminal of the battery, since the internal resistance of the battery itself is increased, the OCV of the battery measured at the discharge terminal may be increased.

In CASE 4, since the positive electrode SOC is 0%, the positive electrode resistance is 1.1Ω. In addition, since the negative electrode SOC is 0%, the negative electrode resistance is 0.67Ω. Therefore, the battery resistance is 1.77Ω.

Specifically, referring to FIGS. 6 and 7, in the case of CASE 4 in which the internal resistance of the battery is reduced, even though the battery resistance is increased at the discharge terminal of the battery, since the internal resistance of the battery itself is reduced, the OCV of the battery measured at the discharge terminal may be reduced.

That is, referring to FIGS. 5 and 7, if the positive electrode SOC is increased, the positive electrode resistance may be decreased, and if the negative electrode SOC is increased, the negative electrode resistance may be decreased. Specifically, the positive electrode SOC may be inversely proportional to the 10-second resistance (R10) of the positive electrode, and the negative electrode SOC may be inversely proportional to the 10-second resistance (R10) of the negative electrode. Accordingly, if the positive electrode SOC and the negative electrode SOC are decreased, the battery resistance may be increased, and if at least one of the positive electrode SOC and the negative electrode SOC is increased, the battery resistance may be decreased.

In addition, if the positive electrode and/or negative electrode side reaction occurs (CASE 1, CASE 2), the OCV of the battery may also be reduced as the battery resistance is reduced. On the other hand, if the internal resistance of the battery is increased or decreased, the OCV of the battery may be increased or decreased in proportion to the increase or decrease of the internal resistance of the battery. That is, when the internal resistance of the battery is increased (CASE 3), the OCV of the battery may also be increased, and when the internal resistance of the battery is decreased (CASE 4), the OCV of the battery may also be decreased.

Figures 14, 15:
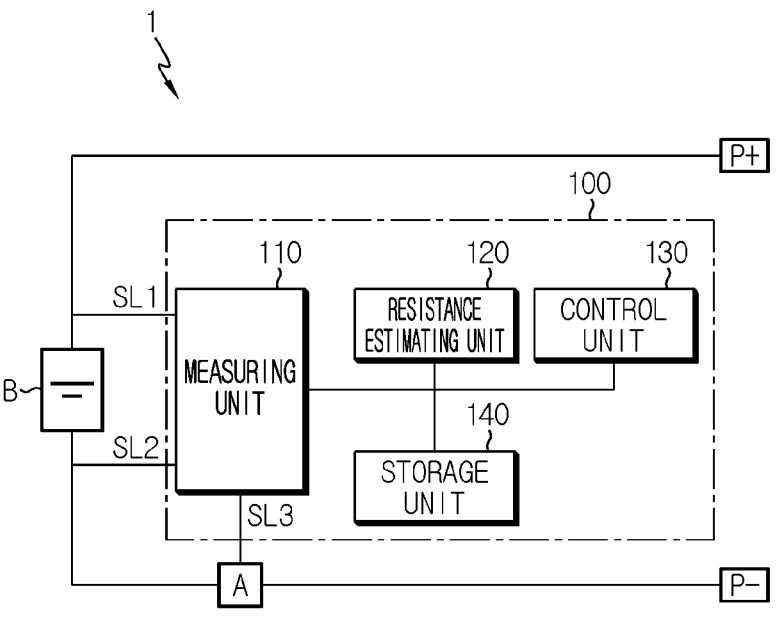
FIG. 14 is a diagram showing a voltage increase/decrease pattern and a resistance increase/decrease pattern for the state of the battery, based on FIGS. 8 to 13.
FIG. 15 is a diagram schematically showing an exemplary configuration of a battery pack according to another embodiment of the present disclosure.

FIGS. 8 to 13 are diagrams showing a voltage deviation or a resistance deviation for each state of the battery according to an embodiment of the present disclosure. FIG. 14 is a diagram showing a voltage increase/decrease pattern and a resistance increase/decrease pattern for the state of the battery, based on FIGS. 8 to 13.

Figure 9:
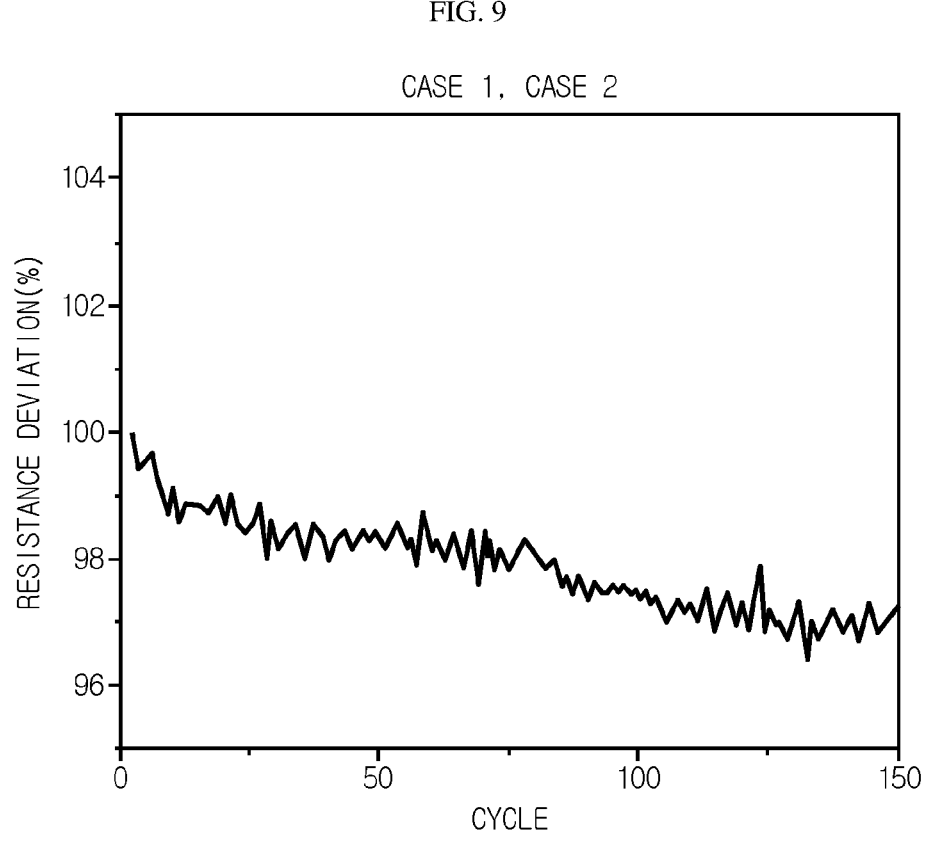
Figures 10, 11:
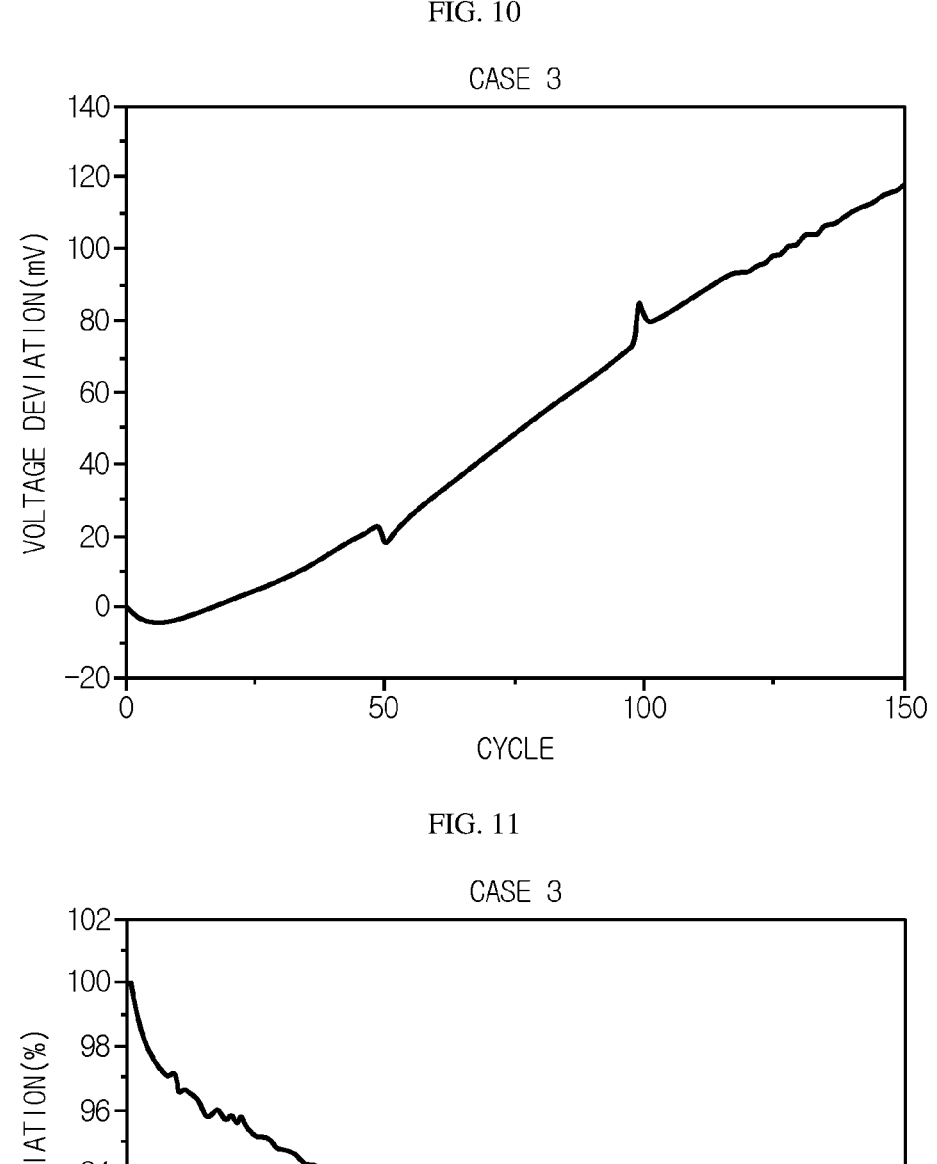
Figures 12, 13:
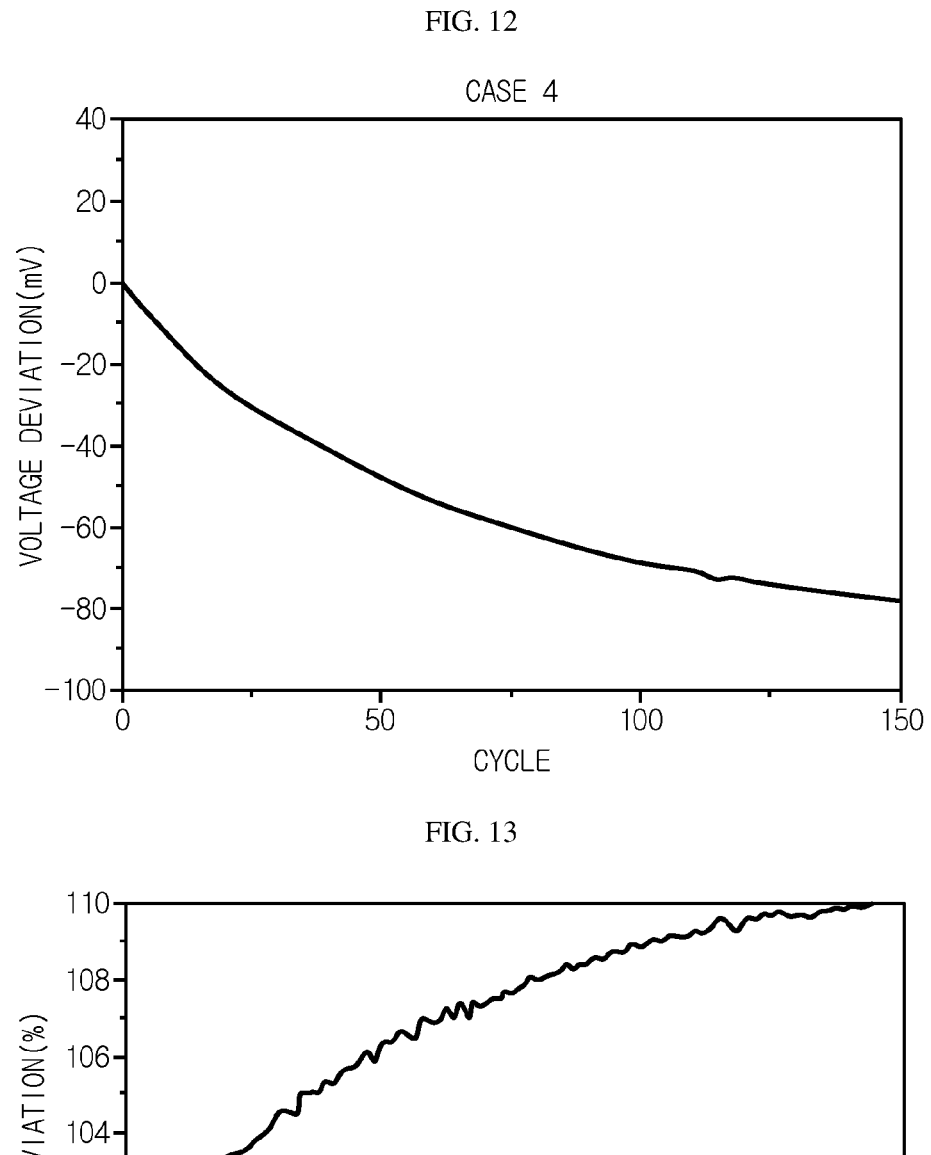

Specifically, FIGS. 8 and 9 are diagrams showing a voltage deviation or a resistance deviation for each cycle (charge/discharge cycle) for the first battery. FIGS. 10 and 11 are diagrams showing a voltage deviation or a resistance deviation for each cycle of the second battery. FIGS. 12 and 13 are diagrams showing a voltage deviation or a resistance deviation for each cycle of the third battery.

Hereinafter, embodiments of the states of the first battery, the second battery and the third battery will be described with reference to FIGS. 8 to 14.

FIGS. 8 and 9 correspond to CASE 1 and CASE 2, where FIG. 8 is a diagram showing a voltage deviation for each cycle and FIG. 9 is a diagram showing a resistance deviation for each cycle.

Referring to FIG. 8, since the voltage deviation decreases as the cycle increases, the control unit 130 may determine the voltage increase/decrease pattern as a decrease pattern. Also, referring to FIG. 9, since the resistance deviation decreases as the cycle increases, the control unit 130 may determine the resistance increase/decrease pattern as a decrease pattern.

Accordingly, the control unit 130 may diagnose the state of the first battery as a side reaction state because both the voltage increase/decrease pattern and the resistance increase/decrease pattern are identically the decrease pattern. That is, the state of the first battery may be a state degraded by a side reaction generated in the positive electrode and/or the negative electrode.

FIGS. 10 and 11 correspond to CASE 3, where FIG. 10 is a diagram showing a voltage deviation for each cycle and FIG. 11 is a diagram showing a resistance deviation for each cycle.

Referring to FIG. 10, since the voltage deviation increases as the cycle increases, the control unit 130 may determine the voltage increase/decrease pattern as an increase pattern. Also, referring to FIG. 11, since the resistance deviation decreases as the cycle increases, the control unit 130 may determine the resistance increase/decrease pattern as a decrease pattern.

Accordingly, the control unit 130 may not diagnose the state of the second battery as a side reaction state because the voltage increase/decrease pattern and the resistance increase/decrease pattern are different. Also, since the voltage increase/decrease pattern is an increase pattern and the resistance increase/decrease pattern is a decrease pattern, the control unit 130 may diagnose the state of the second battery as a resistance increase state. That is, the state of the second battery may be a state degraded due to the increase of an internal resistance.

FIGS. 12 and 13 correspond to CASE 4, where FIG. 12 is a diagram showing a voltage deviation for each cycle and FIG. 13 is a diagram showing a resistance deviation for each cycle.

Referring to FIG. 12, since the voltage deviation decreases as the cycle increases, the control unit 130 may determine the voltage increase/decrease pattern as a decrease pattern. Also, referring to FIG. 13, since the resistance deviation increases as the cycle increases, the control unit 130 may determine the resistance increase/decrease pattern as an increase pattern.

Accordingly, the control unit 130 may not diagnose the state of the third battery as a side reaction state because the voltage increase/decrease pattern and the resistance increase/decrease pattern are different. In addition, since the voltage increase/decrease pattern is a decrease pattern and the resistance increase/decrease pattern is an increase pattern, the control unit 130 may diagnose the state of the third battery as a resistance decrease state.

In the case of CASE 4 according to FIGS. 12 and 13, as in CASE 1, CASE 2 and CASE 3, since the battery resistance is not increased but rather the battery resistance is decreased, it may be interpreted that the battery life is increased. Accordingly, the control unit 130 may diagnose that the battery is not degraded by diagnosing the state of the third battery as a resistance decrease state.

Meanwhile, the control unit 130 may increase the lifespan of the battery by controlling the charging and discharging of the battery to correspond to the diagnosed state of the battery.

Specifically, when the state of the battery is diagnosed as a side reaction state, the control unit 130 may be configured to change at least one of a discharge termination voltage and a charge termination voltage for the battery.

When a side reaction occurs, the degradation of the battery may be accelerated even if the charge C-rate and/or the discharge C-rate are reduced. Accordingly, the control unit 130 may increase the discharge termination voltage or decrease the charge termination voltage in order to slow the degradation progress rate of the battery diagnosed as a side reaction state. Of course, the control unit 130 may increase the discharge termination voltage and decrease the charge termination voltage. That is, the control unit 130 may increase the lifespan of the battery by reducing the available voltage range of the battery.

Conversely, when the state of the battery is diagnosed as a resistance increase state, the control unit 130 may be configured to change at least one of the charge C-rate and the discharge C-rate for the battery.

When the internal resistance of the battery is increased, the state of the battery may be restored by reducing the charge C-rate and/or the discharge C-rate. Accordingly, the control unit 130 may decrease the charge C-rate and/or the discharge C-rate in order to slow the degradation rate of the battery diagnosed as a resistance increase state. That is, the control unit 130 may increase the lifespan of the battery by reducing the charge/discharge rate for the battery.

The battery diagnosing apparatus 100 according to an embodiment of the present disclosure may specifically distinguish and diagnose the state of the battery based on voltage increase/decrease pattern and the resistance increase/decrease pattern, and also has an advantage of increasing the lifespan of the battery by controlling the charge and discharge of the battery to correspond to the diagnosed state of the battery.

The battery diagnosing apparatus 100 according to the present disclosure may be applied to a BMS (Battery Management System). That is, the BMS according to the present disclosure may include the battery diagnosing apparatus 100 described above. In this configuration, at least some components of the battery diagnosing apparatus 100 may be implemented by supplementing or adding functions of the configuration included in the conventional BMS. For example, the measuring unit 110, the resistance estimating unit 120, the control unit 130 and the storage unit 140 of the battery diagnosing apparatus 100 may be implemented as components of the BMS.

In addition, the battery diagnosing apparatus 100 according to the present disclosure may be provided to a battery pack. That is, the battery pack according to the present disclosure may include the battery diagnosing apparatus 100 described above and at least one battery cell. In addition, the battery pack may further include electrical equipment (a relay, a fuse, etc.) and a case.

FIG. 15 is a diagram schematically showing an exemplary configuration of a battery pack 1 according to another embodiment of the present disclosure.

Referring to FIG. 15, the measuring unit 110 may be connected to a first sensing line SL1, a second sensing line SL2 and a third sensing line SL3.

The first sensing line SL1 may be connected to a positive electrode terminal of the battery B, the second sensing line SL2 may be connected to a negative electrode terminal of the battery B, and the third sensing line SL3 may be connected to a current measuring unit A provided on the charge/discharge path of the battery B. Here, the charge/discharge path is a path through which a charge current and a discharge current for the battery B flow, and may be a path to which a positive electrode terminal (P+) of the battery pack 1, the battery B, and a negative electrode terminal (P−) of the battery pack 1 are connected.

The measuring unit 110 may measure a positive electrode voltage of the battery B through the first sensing line SL1 and measure a negative electrode voltage of the battery B through the second sensing line SL2. In addition, the measuring unit 110 may measure the voltage of the battery B by calculating a difference between the positive electrode voltage and the negative electrode voltage of the battery B.

In addition, the measuring unit 110 may measure a current of the battery B through a third sensing line SL3. For example, the current measuring unit A may be a shunt resistor or current meter.

In addition, the measuring unit 110, the resistance estimating unit 120, the control unit 130, and the storage unit 140 may be connected to communicate with each other.

For example, it is assumed that the control unit 130 diagnoses the state of the battery B and sets the charge/discharge condition of the battery B to correspond to the diagnosed state. In this case, when the battery pack 1 is connected to a charging device, the battery B may be charged and/or discharged according to the charge and discharge conditions set by the control unit 130. Accordingly, by preventing the degradation of the battery B from being accelerated, the lifespan of the battery B may be increased.

Figure 16:
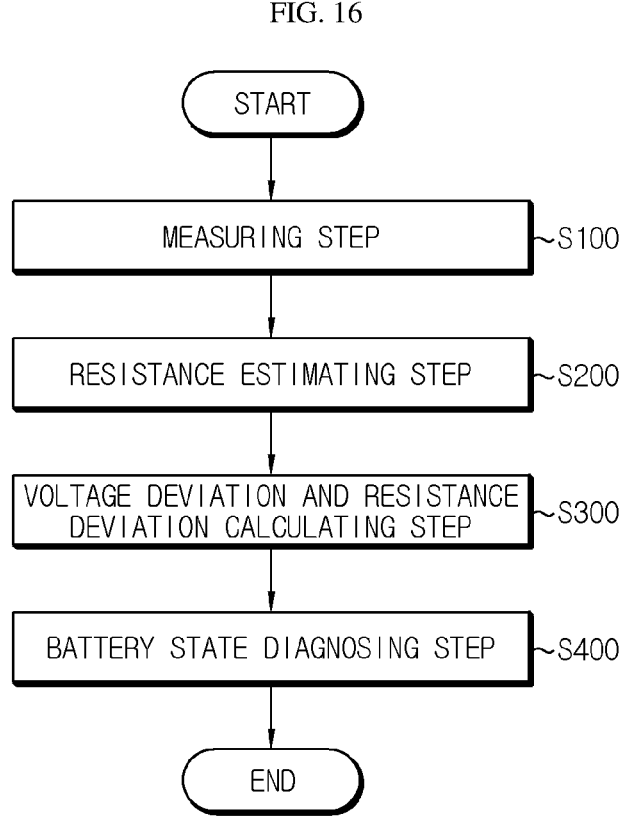
FIG. 16 is a diagram schematically showing a battery diagnosing method according to still another embodiment of the present disclosure.

FIG. 16 is a diagram schematically showing a battery diagnosing method according to still another embodiment of the present disclosure.

Each step of the battery diagnosing method may be performed by the battery diagnosing apparatus 100. Hereinafter, for convenience of explanation, content overlapping with the previously described content will be omitted or briefly described.

Referring to FIG. 16, the battery diagnosing method may include a voltage measuring step (S100), a resistance estimating step (S200), a voltage deviation and resistance deviation calculating step (S300) and a battery state diagnosing step (S400).

The voltage measuring step (S100) is a step of measuring a current, a voltage and an OCV of the battery, and may be performed by the measuring unit 110.

For example, the measuring unit 110 may measure a discharge current of the battery while the battery is being discharged. Preferably, the battery may be discharged with a constant current.

In addition, the measuring unit 110 may determine a first voltage (corresponding to a discharge termination voltage) of the battery at a first time point at which the battery voltage reaches a discharge termination voltage and thus the discharge of the battery is stopped, and measure a second voltage of the battery at a second time point at which a predetermined time (e.g., 10 seconds) has elapsed from the first time point. In addition, the measuring unit 110 may measure an OCV of the battery at a third time point (e.g., a time point at which 30 minutes has elapsed from the first time point) later than the second time point.

The resistance estimating step (S200) is a step of estimating a resistance of the battery based on the current and the voltage measured in the measuring step (S100), and may be performed by the resistance estimating unit 120.

Specifically, the resistance estimating unit 120 may estimate the resistance of the battery based on a voltage change during a predetermined time (e.g., 10 seconds) after the discharge of the battery is stopped.

For example, the resistance estimating unit 120 may estimate the resistance of the battery by calculating a ratio of deviation of the first voltage and the second voltage with respect to the discharge current. More specifically, the resistance estimating unit 120 may estimate the resistance of the battery by calculating the formula of "(second voltage−first voltage)÷discharge current". The resistance of the battery estimated by the resistance estimating unit 120 may be expressed as 10-second resistance (R10).

The voltage deviation and resistance deviation calculating step (S300) is a step of calculating a voltage deviation for a criterion OCV set to correspond to the battery and the OCV measured in the measuring step (S100) and calculating a resistance deviation for a criterion resistance set to correspond to the battery and the resistance estimated in the resistance estimating step (S200), and may be performed by the control unit 130.

For example, the control unit 130 may calculate the voltage deviation for the battery by calculating the formula of "measured OCV−criterion OCV". In addition, the control unit 130 may calculate the resistance deviation for the battery by calculating the formula of "estimated resistance÷criterion resistance×100".

The battery state diagnosing step (S400) is a step of diagnosing a state of the battery based on a voltage increase/decrease pattern for voltage deviation and a resistance increase/decrease pattern for resistance deviation, and may be performed by the control unit 130.

Here, the voltage increase/decrease pattern and the resistance increase/decrease pattern may be a decrease pattern or an increase pattern.

For example, when both the voltage increase/decrease pattern and the resistance increase/decrease pattern are an increase pattern or a decrease pattern, the control unit 130 may diagnose the battery state as a side reaction state.

As another example, when the voltage increase/decrease pattern is an increase pattern and the resistance increase/decrease pattern is a decrease pattern, the control unit 130 may diagnose the state of the battery as a resistance increase state.

As still another example, when the voltage increase/decrease pattern is a decrease pattern and the resistance increase/decrease pattern is an increase pattern, the control unit 130 may diagnose the state of the battery as a resistance decrease state.

The battery diagnosing method may further include a battery charge/discharge controlling step (not shown) performed after the battery state diagnosing step (S400).

Specifically, the battery charge/discharge controlling step is a step of controlling the charge/discharge of the battery to correspond to the state of the battery diagnosed in the battery state diagnosing step (S400), and may be performed by the control unit 130.

For example, when the state of the battery is diagnosed as a side reaction state, the control unit 130 may be configured to change at least one of a discharge termination voltage and a charge termination voltage for the battery.

As another example, when the state of the battery is diagnosed as a resistance increase state, the control unit 130 may be configured to change at least one of a charge C-rate and a discharge C-rate for the battery.

That is, the battery diagnosing method may not only distinguish and diagnose the state of the battery specifically based on the voltage increase/decrease pattern and the resistance increase/decrease pattern, but also has an advantage of extending the life of the battery by controlling the charge/discharge of the battery to correspond to the diagnosed state of the battery.

The embodiments of the present disclosure described above may not be implemented only through an apparatus and a method, but may be implemented through a program that realizes a function corresponding to the configuration of the embodiments of the present disclosure or a recording medium on which the program is recorded. The program or recording medium may be easily implemented by those skilled in the art from the above description of the embodiments.

The present disclosure has been described in detail. However, it should be understood that the detailed description and specific examples, while indicating preferred embodiments of the disclosure, are given by way of illustration only, since various changes and modifications within the scope of the disclosure will become apparent to those skilled in the art from this detailed description.

Additionally, many substitutions, modifications and changes may be made to the present disclosure described hereinabove by those skilled in the art without departing from the technical aspects of the present disclosure, and the present disclosure is not limited to the above-described embodiments and the accompanying drawings, and each embodiment may be selectively combined in part or in whole to allow various modifications.

REFERENCE SIGNS

1: battery pack
100: battery diagnosing apparatus
110: measuring unit
120: resistance estimating unit
130: control unit 140: storage unit
A: current measuring unit
B: battery

What is claimed is:

1. A battery control apparatus, comprising:
a controller; and
memory having programmed thereon instructions that, when executed, are configured to cause the controller to:
  calculate a voltage deviation between a threshold open circuit voltage (OCV) corresponding to the battery and a measured OCV of the battery;
  calculate a resistance deviation between a threshold resistance corresponding to the battery and an estimated resistance based on a measured voltage and a measured current of the battery;
  diagnose a state of the battery based on a combination of a voltage increase/decrease pattern for the voltage deviation and a resistance increase/decrease pattern for the resistance deviation; and
  adjust a charging and/or discharging condition of the battery based on the diagnosed state of the battery.

2. The battery control apparatus according to claim 1, wherein the state of the battery is one of a side reaction state, a resistance increase state or a resistance decrease state.

3. The battery control apparatus according to claim 2, wherein the instructions are configured to cause the controller to diagnose the state of the battery as the side reaction state, the resistance increase state or the resistance decrease state based at least in part on a comparison of the voltage increase/decrease pattern and the resistance increase/decrease pattern.

4. The battery control apparatus according to claim 3, wherein the instructions are configured to cause the controller to:
diagnose the state of the battery as the side reaction state in response to the voltage increase/decrease pattern and the resistance increase/decrease pattern being identical to each other; and
diagnose the state of the battery as the resistance increase state or the resistance decrease state, in response to the voltage increase/decrease pattern and the resistance increase/decrease pattern being different from each other.

5. The battery control apparatus according to claim 4, wherein the instructions are configured to cause the controller to diagnose the state of the battery as the resistance increase state, in response to the voltage increase/decrease pattern increasing and the resistance increase/decrease pattern decreasing.

6. The battery control apparatus according to claim 4, wherein the instructions are configured to cause the controller to diagnose the state of the battery as the resistance decrease state, in response to the voltage increase/decrease pattern decreasing and the resistance increase/decrease pattern increasing.

7. The battery control apparatus according to claim 2, wherein the side reaction state includes at least one of a first degradation state caused by occurrence of a positive electrode side reaction of the battery and a second degradation state caused by occurrence of a negative electrode side reaction.

8. The battery control apparatus according to claim 2,
wherein the instructions are configured to cause the controller to:

change at least one of a discharge termination voltage and a charge termination voltage for the battery in response to the state of the battery being diagnosed as the side reaction state; and change at least one of a charge current rate (C-rate) and a discharge C-rate for the battery in response to the state of the battery being diagnosed as the resistance increase state.

9. The battery control apparatus according to claim 1,
wherein the instructions are configured to cause the controller to:

at each of a plurality of different time points; calculate the voltage deviation and the resistance deviation;

determine the voltage increase/decrease pattern based on the plurality of calculated voltage deviations; and determine the resistance increase/decrease pattern based on the plurality of calculated resistance deviations.

10. The battery control apparatus according to claim 1,
wherein the instructions are configured to cause the controller to:

calculate the resistance deviation based on a ratio between (i) a difference between a first voltage of the battery measured at a first time point at which the battery is discharged to a discharge termination voltage, and a second voltage of the battery measured at a second time point at which a predetermined time has elapsed from the first time point and (ii) a discharge current of the battery; and calculate the voltage deviation based on an OCV measured at a third time point later than the second time point.

11. A battery pack, comprising the battery diagnosing apparatus according to claim 1.

12. A battery control method, comprising:

measuring a current, a voltage and an OCV of a battery;

estimating a resistance of the battery based on the current and the voltage measured in the measuring step;

calculating, by a controller, a voltage deviation between a threshold OCV corresponding to the battery and the OCV;

calculating, by the controller, a resistance deviation between a threshold resistance corresponding to the battery and the resistance; and diagnosing a state of the battery based on a combination of a voltage increase/decrease pattern for the voltage deviation and a resistance increase/decrease pattern for the resistance deviation; and adjusting, by the controller, a charging and/or discharging condition of the battery based on the diagnosed state of the battery.

13. The battery control apparatus according to claim 1,
wherein the instructions are configured to cause the controller to diagnose a state of the battery as one of a side reaction state, a resistance increase state or a resistance decrease state based on the voltage increase/decrease pattern for the voltage deviation and the resistance increase/decrease pattern for the resistance deviation, wherein the side reaction state is associated with a first cause of degradation and wherein the resistance increase state is associated with a second cause of degradation that is different from the first cause of degradation.

14. The battery control apparatus according to claim 1,
wherein the instructions are configured to cause the controller to perform at least one of an increase to a discharging termination voltage of the battery or a decrease to a charging termination voltage of the battery based on the cause of degradation being a side reaction of a positive or negative electrode of the battery.

15. The battery control apparatus according to claim 1,
wherein the instructions are configured to cause the controller to perform at least one of a decrease to a charge C-rate of the battery or a decrease to a discharge C-rate of the battery based on the cause of degradation being an increase in internal resistance of the battery.

16. The battery control apparatus according to claim 2,
wherein the instructions are configured to maintain the charging and/or discharging condition of the battery based on the state of the battery being diagnosed as the resistance decrease state.

* * * * *